United States Patent
Miao et al.

(10) Patent No.: US 11,437,098 B2
(45) Date of Patent: Sep. 6, 2022

(54) OPERATING METHOD FOR IMPROVING PERFORMANCE OF SELECTOR DEVICE

(71) Applicant: HUAZHONG UNIVERSITY OF SCIENCE AND TECHNOLOGY, Hubei (CN)

(72) Inventors: Xiangshui Miao, Hubei (CN); Qi Lin, Hubei (CN); Hao Tong, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 17/037,655

(22) Filed: Sep. 29, 2020

(65) Prior Publication Data

US 2021/0043255 A1    Feb. 11, 2021

Related U.S. Application Data

(63) Continuation-in-part of application No. PCT/CN2019/096066, filed on Jul. 16, 2019.

(30) Foreign Application Priority Data

Feb. 19, 2019    (CN) .......................... 201910123619.4

(51) Int. Cl.
*G11C 11/00*    (2006.01)
*G11C 13/00*    (2006.01)

(52) U.S. Cl.
CPC ........ *G11C 13/0038* (2013.01); *G11C 13/004* (2013.01); *G11C 2213/15* (2013.01)

(58) Field of Classification Search
CPC .............. G11C 13/0038; G11C 13/004; G11C 2213/15; G11C 13/003; G11C 2213/71; G11C 2213/76; G11C 5/14

USPC .......................................................... 365/148
See application file for complete search history.

(56) References Cited

U.S. PATENT DOCUMENTS 9,059,402 B2 *    6/2015    Tada ................... H01L 45/1625

FOREIGN PATENT DOCUMENTS

| CN | 105932035 | 9/2016 |
| CN | 107732010 | 2/2018 |
| CN | 109949836 | 6/2019 |
| WO | 2016122406 | 8/2016 |
| WO | WO-2017039608 A1 * | 3/2017 ......... G11C 2213/76 |

* cited by examiner

*Primary Examiner* — Tha-O H Bui
(74) *Attorney, Agent, or Firm* — JCIP Global Inc.

(57) ABSTRACT

An operating method for improving the performance of a selector device is provided, including: determining and applying a direct current (DC) or alternating current (AC) operating voltage and a limit current of the selector device, so that the selector device circulates until a off-state resistance is reduced; continuously applying the operating voltage and the limit current to the selector device, so that the selector device circulates until the off-state resistance is reduced to a minimum value; continuously applying the operating voltage and the limit current to the selector device, so that the selector device circulates until the off-state resistance is increased; continuously applying the operating voltage and the limit current to the selector device, so that the selector device circulates until the off-state resistance is increased to a maximum value; and adjusting the operating voltage and the limit current, and performing DC or AC operation pulsed operation on a selector.

8 Claims, 2 Drawing Sheets

OPERATING METHOD FOR IMPROVING PERFORMANCE OF SELECTOR DEVICE

CROSS-REFERENCE TO RELATED APPLICATION

This application is a continuation in part of international PCT application serial no. PCT/CN2019/096066, filed on Jul. 16, 2019, which claims the priority benefit of China application no. 201910123619.4, filed on Feb. 19, 2019. The entirety of each of the above mentioned patent applications is hereby incorporated by reference herein and made a part of this specification.

BACKGROUND

Technical Field

The disclosure relates to the technical field of memory operation, and more specifically relates to an operating method for improving the performance of a selector device.

Description of Related Art

The effective element area of the three-dimensional (3D) crosspoint memory is $4F^2/n$, where F is the feature size and n is the number of 3D stacked layers of the memory. The 3D crosspoint memory is the memory with the largest effective storage density at present. Next-generation memories, including phase-change memories, resistive random access memories, magnetic memories, etc., generally adopt 3D crosspoint structures. In the 3D crosspoint memory, the memory element is connected to the memory element by adopting a two-end selector device. The selector device and the memory element are stacked vertically without occupying additional area, and have the ability to expand in three dimensions, which greatly improves the storage density.

As the address selection device in the 3D crosspoint memory, the selector device may effectively suppress leakage current, reduce power consumption, avoid reading and writing errors, and expand the maximum implementable array size. When operating the 3D crosspoint memory element, the selector in the selected memory element is first opened. The selector is reduced to a low resistance state and the operating voltage mostly falls on the memory element. Then, read or write operation is performed on the memory element, and the selector is closed after the operation is completed. Since the selector needs to be opened every time the read or write operation is performed on the memory element, and the selector needs to be kept open to withstand the read or write current, the life span of the selector in the memory has very high requirements, which needs to be higher than the life span of the memory element.

In the prior art, the selector device containing active metal is extremely easy to form a stable conductive path and fail during the circulating process, so that the device stays in the low resistance state, and the stability and the life span of device operation are difficult to be improved.

SUMMARY

In view of the defects of the prior art, the objective of the disclosure is to solve the technical issues of poor stability and short life span of the selector device according to the prior art.

In order to achieve the foregoing objective, in the first aspect, an embodiment of the disclosure provides an operating method for improving the performance of a selector device. The method includes the following steps.

Step S1. A direct current (DC) or alternating current (AC) operating voltage and a limit current of the selector device containing active metal are determined.

Step S2. The determined operating voltage and limit current are applied to the selector device, so that the selector device circulates under DC or AC until an off-state resistance is reduced.

Step S3. The determined operating voltage and limit current are continuously applied to the selector device, so that the selector device circulates under DC or AC until the off-state resistance is reduced to a minimum value.

Step S4. The determined operating voltage and limit current are continuously applied to the selector device, so that the selector device circulates under DC or AC until the off-state resistance is increased.

Step S5. The determined operating voltage and limit current are continuously applied to the selector device, so that the selector device circulates under DC or AC until the off-state resistance is increased to a maximum value.

Step S6. The operating voltage and the limit current are adjusted, and a DC or AC operation or an alternating current (AC) pulsed operation is performed on the selector.

Specifically, the structure of the selector device containing active metal is as follows. A first metal electrode layer, a switch layer, and a second metal electrode layer. At least one of the first metal electrode layer, the second metal electrode layer, or the switch layer contains active metal.

Specifically, the active metal is one or more of Ag, Cu, Co, Ni, and Sn.

Specifically, in Step S1, through a DC or AC test, a minimum voltage for opening the selector device is determined, and the operating voltage is set to be 0.3V to 1V greater than the minimum voltage. Through the DC or AC test, a maximum limit current and a minimum limit current for switching phenomenon of the selector device are determined, and the limit current is set to be 1 to 3 orders of magnitude lower than the maximum limit current, and higher than the minimum limit current.

Specifically, in Step S2, the basis for determining that the off-state resistance is reduced is that the off-state resistance of the selector device is reduced by more than 1 order of magnitude.

Specifically, in Step S3, the basis for determining that the off-state resistance is reduced to the minimum value is that off-state resistances will not be lower than the off-state resistance during previous and subsequent operating processes.

Specifically, in Step S4, the basis for determining that the off-state resistance is increased is that the off-state resistance of the selector device is increased by more than 1 order of magnitude.

Specifically, in Step S5, the basis for determining that the off-state resistance is increased to the maximum value is that an off-state resistance will not be higher than the off-state resistance during a previous operating process, and an off-state resistance is at most higher than the off-state resistance by 0.5 orders of magnitude during a subsequent operating process.

Specifically, Step S6 is specifically as follows. A minimum voltage and current for stably switching the selector device are determined. According to actual operating requirements, a suitable voltage or current that at least satisfies stable switching of the selector are applied to the device, and a DC or AC operation or an AC pulsed operation is performed on the device.

In the second aspect, an embodiment of the disclosure provides a computer-readable storage medium. The computer-readable storage medium is stored with a computer program. The computer program implements the operating method described in the first aspect when being executed by a processor.

DETAILED DESCRIPTION OF DISCLOSED EMBODIMENTS

For the objective, technical solutions, and advantages of the disclosure to be clearer, the disclosure is further described in detail below with reference to the accompanying drawings and the embodiments. It should be understood that the specific embodiments described here are only used to explain the disclosure, but not to limit the disclosure.

Figure 1:
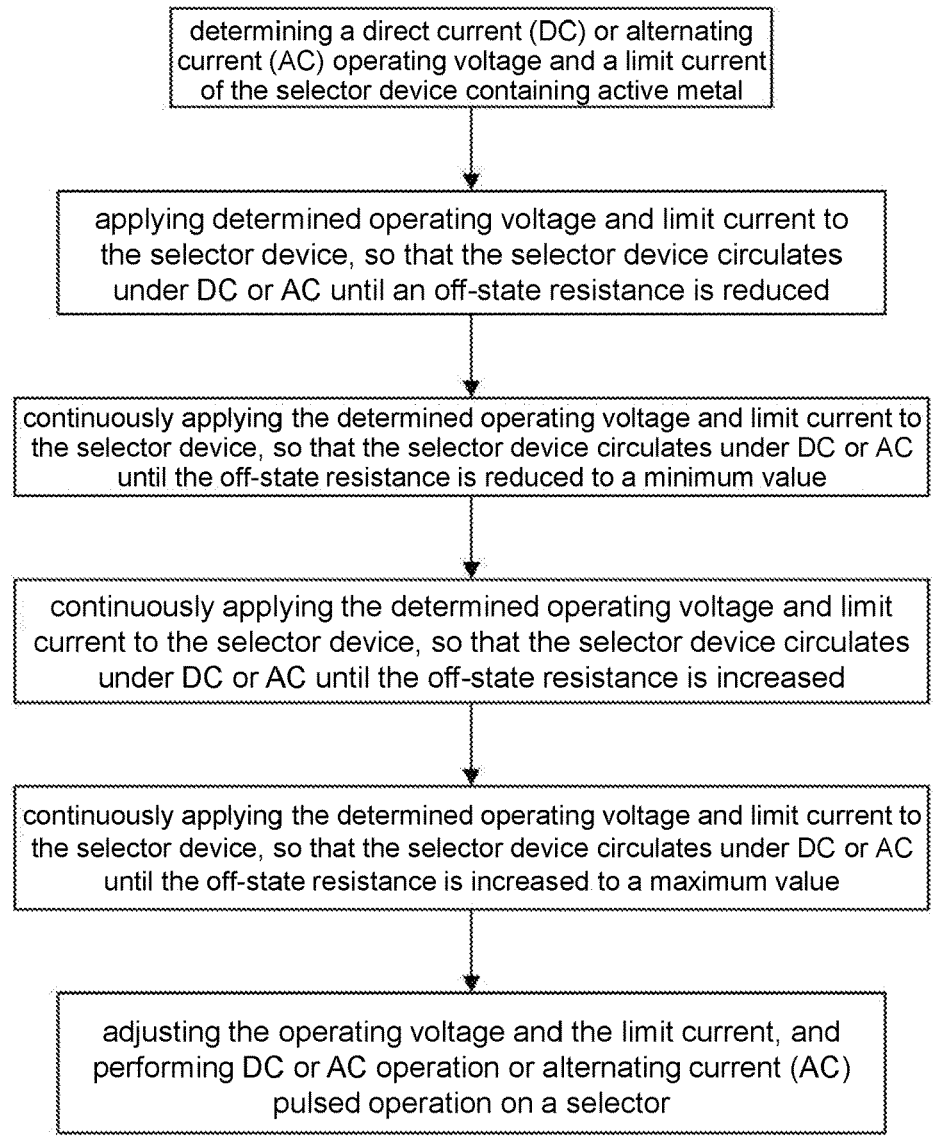
FIG. 1 is a flowchart of an operating method for improving the performance of a selector device according to an embodiment of the disclosure.

As shown in FIG. 1, an operating method for improving the performance of a selector device includes the following steps.

Step S1. A direct current (DC or AC) operating voltage and a limit current of the selector device containing active metal are determined.

Step S2. The determined operating voltage and limit current are applied to the selector device, so that the selector device circulates under DC or AC until an off-state resistance is reduced.

Step S3. The determined operating voltage and limit current are continuously applied to the selector device, so that the selector device circulates under DC or AC until the off-state resistance is reduced to a minimum value.

Step S4. The determined operating voltage and limit current are continuously applied to the selector device, so that the selector device circulates under DC or AC until the off-state resistance is increased.

Step S5. The determined operating voltage and limit current are continuously applied to the selector device, so that the selector device circulates under DC or AC until the off-state resistance is increased to a maximum value.

Step S6. The operating voltage and the limit current are adjusted, and a DC or AC operation or an alternating current (AC) pulsed operation is performed on the selector.

In Step S1, a direct current (DC or AC) operating voltage and a limit current of the selector device containing active metal are determined.

Figure 2:
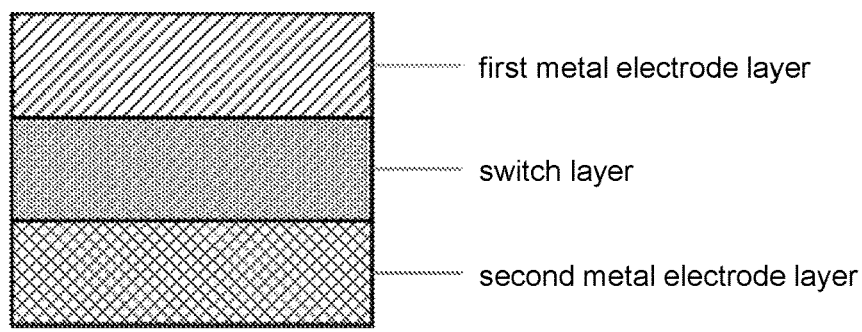
FIG. 2 is a schematic diagram of a structure of a selector device containing active metal according to an embodiment of the disclosure.

As shown in FIG. 2, the structure of the selector device containing active metal is as follows. A first metal electrode layer, a switch layer, and a second metal electrode layer. At least one of the first metal electrode layer, the second metal electrode layer, or the switch layer contains active metal. The active metal is one or more of Ag, Cu, Co, Ni, and Sn.

Through a DC or AC test, a minimum voltage for opening the selector device is determined, and the operating voltage is set to be 0.3V to 1V greater than the minimum voltage.

Through the DC or AC test, a maximum limit current and a minimum limit current for switching phenomenon of the selector device are determined, and the limit current is set to be 1 to 3 orders of magnitude lower than the maximum limit current, and higher than the minimum limit current.

The basis for determining the switching phenomenon is that the device may automatically restore to a high-resistance closed state after the voltage is removed.

In Step S2, the determined operating voltage and limit current are applied to the selector device, so that the selector device circulates under DC or AC until an off-state resistance is reduced.

Figure 3:
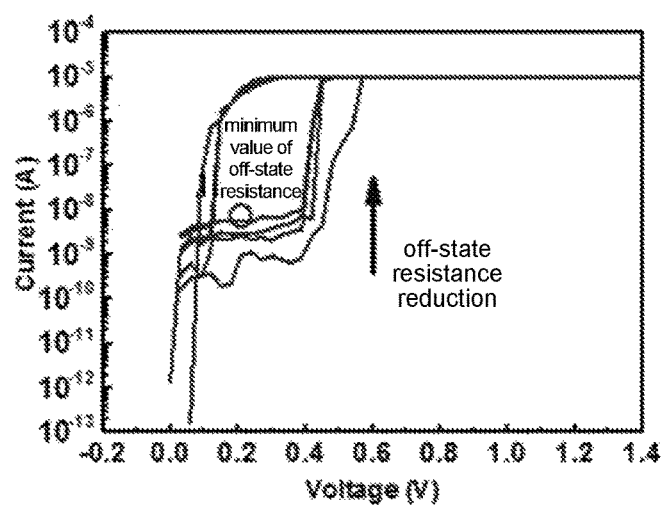
FIG. 3 is a schematic diagram of an off-state resistance reduction according to an embodiment of the disclosure.

The selector is equivalent to a switch. The off-state resistance refers to the resistance when the selector is closed. As shown in FIG. 3, the basis for determining that the off-state resistance is reduced is that the off-state resistance of the selector device is reduced by more than 1 order of magnitude.

In Step S3, the determined operating voltage and limit current are continuously applied to the selector device, so that the selector device circulates under DC or AC until the off-state resistance is reduced to the minimum value.

From Step S2 to Step S3, the off-state resistance may be increased or reduced until the off-state resistance is reduced to the minimum value. The basis for determining that the off-state resistance is reduced to the minimum value is that off-state resistances will not be lower than the off-state resistance during previous and subsequent operating processes.

In Step S4, the determined operating voltage and limit current are continuously applied to the selector device, so that the selector device circulates under DC or AC until the off-state resistance is increased.

Figure 4:
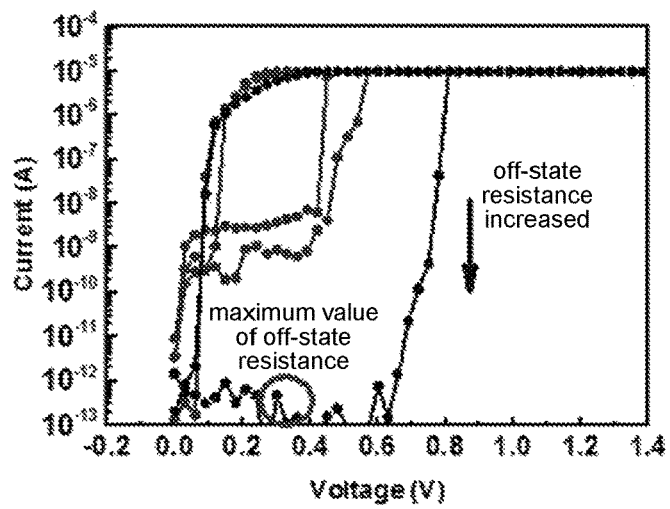
FIG. 4 is a schematic diagram of an off-state resistance rises according to an embodiment of the disclosure.

As shown in FIG. 4, the basis for determining that the off-state resistance is increased is that the off-state resistance of the selector device is increased by more than 1 order of magnitude.

In Step S5, the determined operating voltage and limit current are continuously applied to the selector device, so that the selector device circulates under DC or AC until the off-state resistance is increased to the maximum value.

From Step S4 to Step S5, the off-state resistance may be increased or reduced until the off-state resistance is increased to the maximum value. The basis for determining that the off-state resistance is increased to the maximum value is that an off-state resistance will not be higher than the off-state resistance during a previous operating process, and an off-state resistance is at most higher than the off-state resistance by 0.5 orders of magnitude during a subsequent operating process.

In Step S6, the operating voltage and the limit current are adjusted, and a DC or AC operation or an AC pulsed operation is performed on the selector.

Figure 5:
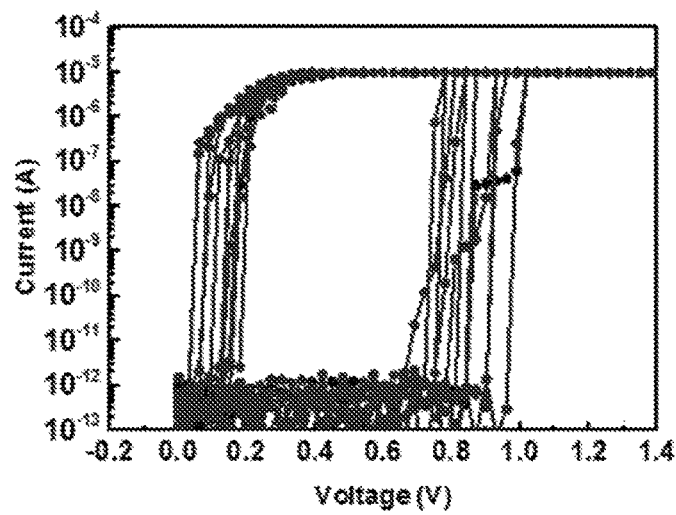
FIG. 5 is a schematic diagram of adjusting an operating voltage and a limit current to a suitable value according to an embodiment of the disclosure.

The step of adjusting the operating voltage and the limit current is determining the minimum voltage and current for stably switching the selector device. As shown in FIG. 5, according to actual operating requirements, a suitable voltage or current that at least satisfies stable switching of the selector are applied to the device, and a DC or AC operation or an AC pulsed operation is performed on the device.

In general, compared with the prior art, the above technical solutions conceived by the disclosure have the following beneficial effects.

The disclosure is directed to the two-end selector device containing active metal. Through operating the selector after allowing the selector device to experience the failure of the off-state resistance reduction by circulating under DC or AC, then experiencing the off-state resistance rise, and finally restoring to the normal state with the maximum off-state resistance, operating stability is effectively improved to have better DC or AC circulating characteristics, which greatly improves the circulating life span of the device. In addition, during the DC or AC circulating process, the required operating voltage of the device is close to the actual voltage for opening the device, so additional large voltage is not required, power consumption is reduced, and peripheral circuit design or operating complexity of the device is simplified.

The above are only preferred specific implementations of the disclosure, but the protection scope of the disclosure is not limited thereto. Any person skilled in the art can easily think of changes or replacements within the technical scope of the disclosure, which should all be covered within the protection scope of the disclosure. Therefore, the protection scope of the disclosure should be subject to the protection scope of the claims.

What is claimed is:

1. An operating method for improving performance of a selector device, wherein the operating method comprises:
   Step S1 of determining a direct c (DC) or alternating current (AC) operating voltage and a limit current of the selector device containing active metal;
   Step S2 of applying determined operating voltage and limit current to the selector device, so that the selector device circulates under DC or AC until an off-state resistance is reduced;
   Step S3 of continuously applying the determined operating voltage and limit current to the selector device, so that the selector device circulates under DC or AC until the off-state resistance is reduced to a minimum value;
   Step S4 of continuously applying the determined operating voltage and limit current to the selector device, so that the selector device circulates under DC or AC until the off-state resistance is increased;
   Step S5 of continuously applying the determined operating voltage and limit current to the selector device, so that the selector device circulates under DC or AC until the off-state resistance is increased to a maximum value; and
   Step S6 of adjusting the operating voltage and the limit current, and performing a DC or AC operation or an alternating current (AC) pulsed operation on a selector;
   wherein Step S6 comprises: determining a minimum voltage and current for stably switching the selector device; and applying a suitable voltage or current that at least satisfies stably switching the selector to the selector device according to actual operating requirements, and performing the DC or AC operation or the AC pulsed operation on the selector device.

2. The operating method according to claim 1, wherein a structure of the selector device containing active metal is a first metal electrode layer, a switch layer, and a second metal electrode layer; wherein at least one of the first metal electrode layer, the second metal electrode layer, or the switch layer contains active metal.

3. The operating method according to claim 1, wherein the active metal comprises one or more of Ag, Cu, Co, Ni, and Sn.

4. The operating method according to claim 1, wherein in Step S1, through a DC or AC test, a minimum voltage for opening the selector device is determined, and the operating voltage is set to be 0.3V to 1V greater than the minimum voltage; and through the DC or AC test, a maximum limit current and a minimum limit current for switching phenomenon of the selector device to occur are determined, and the limit current is set to be 1 to 3 orders of magnitude lower than the maximum limit current, and higher than the minimum limit current.

5. The operating method according to claim 1, wherein in Step S2, a basis for determining that the off-state resistance is reduced is that the off-state resistance of the selector device is reduced by more than 1 order of magnitude.

6. The operating method according to claim 1, wherein in Step S3, a basis for determining that the off-state resistance is reduced to the minimum value is that the off-state resistance will not be lower than the off-state resistances during previous and subsequent operating processes.

7. The operating method according to claim 1, wherein in Step S4, a basis for determining that the off-state resistance is increased is that the off-state resistance of the selector device is increased by more than 1 order of magnitude.

8. The operating method according to claim 1, wherein in Step S5, a basis for determining that an off-state resistance is increased to a maximum value is that the off-state resistance will not be higher than the off-state resistances during a previous operating process, and an off-state resistance is at most higher than the off-state resistance by 0.5 orders of magnitude during a subsequent operating process.

* * * * *